US012709794B2

(12) United States Patent
Lin et al.

(10) Patent No.: US 12,709,794 B2
(45) Date of Patent: Aug. 18, 2026

(54) VARIABLE HARDNESS NANOCOMPOSITE COATING

(71) Applicant: Southwest Research Institute, San Antonio, TX (US)

(72) Inventors: Jianliang Lin, Helotes, TX (US); Peter Mark Lee, Fair Oaks Ranch, TX (US); Lake Speed, Jr., Concord, NC (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 0 days.

(21) Appl. No.: 18/469,850

(22) Filed: Sep. 19, 2023

(65) Prior Publication Data

US 2024/0093351 A1 Mar. 21, 2024

Related U.S. Application Data

(60) Provisional application No. 63/376,120, filed on Sep. 19, 2022.

(51) Int. Cl.

| | |
|---|---|
| ***C23C 14/06*** | (2006.01) |
| ***C23C 14/34*** | (2006.01) |
| ***C23C 14/35*** | (2006.01) |
| *B82Y 30/00* | (2011.01) |

(52) U.S. Cl.

CPC ...... *C23C 14/0641* (2013.01); *C23C 14/3414* (2013.01); *C23C 14/35* (2013.01); *B82Y 30/00* (2013.01)

(58) Field of Classification Search

CPC . C23C 14/0641; C23C 14/3414; C23C 14/35; C23C 14/0057; C23C 14/0664; C23C 14/352; C23C 14/505; C23C 14/355; B82Y 30/00

USPC ....................................... 204/192.15, 192.16

See application file for complete search history.

(56) References Cited

U.S. PATENT DOCUMENTS

| | | | |
|---|---|---|---|
| 9,523,146 | B1 | 12/2016 | Lin et al. |
| 10,316,970 | B2 | 6/2019 | Lin et al. |
| 2011/0188950 | A1 | 8/2011 | Ahlgren |

FOREIGN PATENT DOCUMENTS

| | | | |
|---|---|---|---|
| CN | 112853282 A * | 5/2021 | |
| JP | 2007-277663 | 10/2007 | |
| WO | 2014/156897 | 10/2014 | |

OTHER PUBLICATIONS

Machine Translation WO2014156897 (Year: 2014).*
Machine Translation JP-2007277663 (Year: 2007).*
Machine Translation CN 112853282 A (Year: 2021).*
International Search Report and Written Opinion from related PCT Appln. No. PCT/US2023/074533, dated Jan. 19, 2024.

* cited by examiner

*Primary Examiner* — Rodney G Mcdonald
(74) *Attorney, Agent, or Firm* — Secant IP, PLLC

(57) ABSTRACT

A variable hardness nanocomposite coating and method for its production. The variable hardness nanocomposite coating can be applied as a single layer on metallic engine components that require a break-in to achieve physical mating of interacting surfaces thereby reducing friction and optimizing engine performance. The single layer nanocomposite coating has a relatively higher carbon content and lower hardness at the surface region and a relatively lower carbon content and relatively higher hardness region as one proceeds towards a surface of the metal component being coated.

12 Claims, 2 Drawing Sheets
(2 of 2 Drawing Sheet(s) Filed in Color)

VARIABLE HARDNESS NANOCOMPOSITE COATING

FIELD

The present invention is directed at a variable hardness nanocomposite coating. The variable hardness nanocomposite coating may be applied in a single layer on engine and drivetrain metallic parts that require a break-in to achieve physical mating of interacting surfaces thereby reducing friction and optimizing engine performance.

BACKGROUND

Mechanical interacting parts typically require a break-in or run-in period to reduce friction and to ensure relatively long and efficient engine operation. Examples of such metallic parts include gears, rings and liners, and camshafts within internal combustions engines. This break-in can be improved if a coating, e.g., silver, copper, Babbitt or graphene oxide, is placed on the metallic part surface. Such coatings can be relatively softer than the underlying metallic material and more readily worn away by a counter surface to provide a relatively smooth surface for surface longevity. Another example of this includes phosphate based coatings (e.g, manganese phosphate) which have been reportedly applied to diesel tappets for break-in with the camshaft under relatively high load conditions.

With the increase in speed and loadings of engine gears, and the increased need to control emissions and reduce friction in piston ring and liner surface interactions, coatings have been applied to such surfaces for normal engine operation. Such coatings are typically single layer coatings with a homogenous hardness and composition. Examples include chrome, molybdenum spray, CrN, TiN and diamond like carbon (DLC) coatings.

A need therefore remains for variable hardness single layer coating that would provide a relatively lower hardness surface to facilitate engine break-in with an increase in hardness as one proceeds from the surface of the coating towards the metallic substrate. Such a variable hardness single-layer coating is contemplated to resolve the shortcomings of a single layer, single hardness coating, as well as the problems of a dual-layer coating, where each layer may have a different hardness.

SUMMARY

A metal part comprising a Ti—Si—C—N single layer nanocomposite coating on a surface of the metal part where the coating has a thickness in the range of 5.0 μm to 40 μm. A surface region of the coating has a relatively low hardness and the coating hardness increases from the coating surface region down to the surface of the metal part.

A method of coating a metal part for an engine with a magnetron sputtering system having a process chamber including a magnetron and a Ti target comprising:

placing the metal part into said process chamber;

reducing gas pressure in said chamber;

supplying an inert gas to said process chamber and generating a plasma for said inert gas;

supplying nitrogen to said process chamber;

supplying both a carbon/silicon containing gas and a carbon containing gas to said process chamber;

sputtering titanium from a magnetron target in said process chamber; and depositing a single layer Ti—Si—C—N coating on said metal part at a thickness in the range of 5.0 μm to 40 μm, wherein a surface region of said coating has a relatively low hardness and said coating hardness increases from said coating surface region down to said metal substrate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
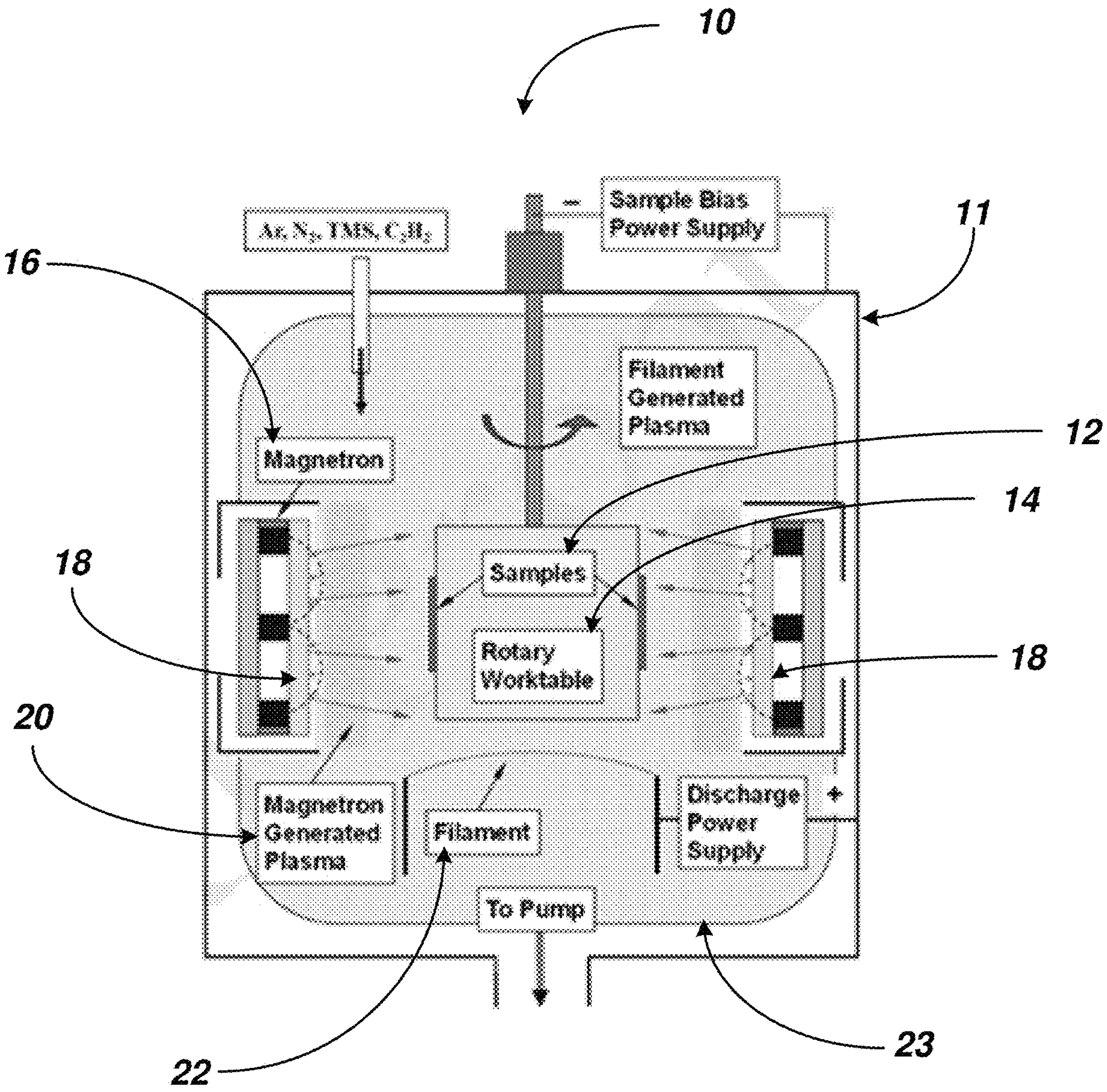
FIG. 1 provides a schematic drawing of the preferred plasma-enhanced magnetron sputtering system.

The present invention is directed at a variable hardness, single layer nanocomposite coating, for application to substrates such as engine metallic parts, that is particularly suitable to optimize the break-in period to achieve physical mating of interacting surfaces thereby reducing friction and optimizing engine performance. The variable hardness single layer nanocomposite coating herein is contemplated to provide a surface region with a relatively lower hardness to facilitate break-in and a relatively higher hardness as one proceeds from the coated surface region towards the metallic part or substrate, which relatively higher hardness can then provide improved durability of the metallic part within the engine or driveline environment. By reference to single layer, it is understood that the layer is formed continuously as one layer during the deposition process described herein.

Preferably, the single layer variable hardness nanocomposite coating herein comprises a Ti—Si—C—N coating. Reference is made to U.S. Pat. No. 9,523,146 entitled Ti—Si—C—N piston ring coatings, whose teachings are incorporated by reference. The single layer variable hardness nanocomposite coating herein preferably comprises, consists essentially of, or consists of: (1) titanium in the range of 35 to 49 atomic percent, including all individual values and ranges therein; (2) silicon present in the range of 1 to 5 atomic percent, including all individual values and ranges therein; (3) carbon in the range of 17 to 50 atomic percent, including all individual values and ranges therein; and (4) nitrogen present in the range of 19 to 35 atomic percent, including all individual values and ranges therein. However, by adjusting the composition of Ti—Si—C—N within the single layer nanocomposite coating on an engine or driveline metallic part, during the formation of the single layer coating, a variable carbon gradient and variable hardness gradient can be achieved. Namely a nanocomposite coating having a relatively higher carbon content and lower hardness in the surface region and a relatively lower carbon content and relatively higher hardness region as one proceeds down and beneath the surface region towards the surface of the metal part being coated.

The Ti—Si—C—N nanocomposite coatings are preferably deposited using physical vapor deposition. Preferably, plasma enhanced magnetron sputtering of titanium in the presence of nitrogen, hexamethyldisilizane (HMDS) or tetramethylsilane (TMS) and a carbon containing gas (e.g. acetylene or $C_2H_2$). HMDS has the formula $C_6H_{19}NSi_2$ and TMS has the formula $C_4H_{12}Si$, in which case they may be understood as providing carbon as well as silicon, and be further understood herein as a carbon/silicon containing gas, optionally containing nitrogen.

It is therefore contemplated that when forming the single layer nanocomposite coating, the physical vapor deposition conditions can be adjusted, as well as flow rates of the plasma precursors, to promote a composition gradient that provides both a carbon gradient and a hardness gradient within the single layer nanocomposite coating.

In particular, during physical vapor deposition, the flow rates of the carbon/silicon containing gas (HMDS and/or TMS) and/or the carbon containing gas (e.g. acetylene) are now adjusted. As alluded to above, the objective is to provide an increase in the carbon content from the base of the nanocomposite coating at the interface region with the metal substrate up to the surface region of the coating. Such an increase in carbon compositional content during deposition of the single layer nanocomposite coating is preferably first achieved by increasing the flow of carbon containing gas, which as noted, is preferably acetylene, as such gas provides a good source of carbon. However, it may be appreciated that the carbon compositional content of the nanocomposite coating can also be increased by increasing the flow of the carbon/silicon gas (HMDS and/or TMS). In turn, the hardness gradient of the nanocomposite coating on the metallic part will then proceed from a relatively lower value at the surface region of the coating and a relatively higher hardness in the internal region of the coating down towards the metal substrate interface.

It should also be noted that introduction of carbon/silicon gas (HMDS or TMS) serves the additional purpose of allowing for the formation of a $Si_3N_4$ amorphous phase ($Si_3N_{4amorphous}$) and carbon amorphous phase, ($C_{amorphous}$) along with a Ti—C—N crystalline phase ($Ti—C—N_{crystalline}$). Such combination of amorphous and crystalline morphologies ($Si—N_{amorphous}+C_{amorphous}+Ti—C—N_{crystalline}$) then provides the nanocomposite coating herein with both amorphous and crystalline phases.

The single layer nanocomposite coating may preferably be formed at a thickness of 5.0 μm to 40.0 μm, including all individual values and ranges therein. As noted, the single layer nanocomposite coating is now contemplated to have a variable hardness, which hardness can fall in the range of 5.0 GPa to 30.0 GPa. That is, the single layer coating is contemplated to now provide a hardness gradient thereby resulting in a relatively soft hardness at the surface region (e.g. 5.0-10.0 GPa) to a relatively higher hardness in the remainder of the coating thickness, below the surface region and down to the surface of the metallic substrate (e.g., greater than 10.0 GPa or in the range of greater than 10.0 GPa to 30.0 GPa).

Accordingly, by way of example, for a 40 μm coating, the coating preferably has a hardness in the range of 5.0 GPa to 10.0 GPa from the surface of the coating down to a depth of up to 5.0 μm, and a hardness in the range of greater than 10.0 GPa from a depth of greater than 5.0 μm to 40.0 μm, (which is down to the metal substrate surface). However, in the broad context of the present invention, the surface region of the coating should be understood as that region where it is desirable to provide relatively lower hardness in the coating thickness for a given break-in or run in period for a given mechanical part.

By way of further example, for a 20 μm coating, it is contemplated that at the coating surface and down to a depth of up to 5.0 μm would provide a hardness of 5.0 GPa to 10.0 GPa, which can be relied upon to facilitate break-in of a given metallic part. Then, the remaining 15.0 μm of coating would preferably provide a hardness of greater than 10.0 GPa, and more preferably in the range of 15.0 GPa to 20.0 GPa. For a given coating of depth of 20.0 μm or 40.0 μm, every 5 μm of incremental depth from the initially exposed surface of the coating and down to the metallic substrate, the hardness is contemplated to preferably increase by 5-10 GPa, including all individual values and ranges thereon, up to a preferred maximum of 30 GPa. The hardness gradient therefore can also preferably provide a relatively steady and continuous reduction in hardness as one proceeds from the exposed surface of the coating inwardly to the metallic substrate.

It is also further contemplated herein that once the relatively lower hardness coating is removed during break-in, the remaining relatively higher hardness portion of the coating, now with an exposed surface, will provide a wear rate of less than $10\times10^{-6}$ $mm^3/N/m$, wherein the wear rate is determined via a pin-on-disc tribometer using an alumina ball of 0.25 inches at a load of 1 N at 100 rpm in a dry environment. The remaining relatively higher hardness nanocomposite coating with the now exposed surface is also contemplated to have a coefficient of friction of less than 0.15, as measured on a Plint TE77 testing apparatus using a 10W-30 oil maintained at 35° C., a normal force of 30 N and a sliding frequency of 5 Hz to 20 Hz.

Working Example

Reactive sputtering of multiple titanium (Ti) targets in a mixture of argon (Ar), nitrogen ($N_2$), tetramethylsilane (TMS), and acetylene ($C_2H_2$) leads to the formation of single layer Ti—Si—C—N nanocomposite coatings herein having both a carbon compositional gradient and a hardness gradient. The substrates utilized for such coating was a mirror polished SS304 stainless steel coupons (25.4 mm×25.4 mm×3 mm) and steel piston rings. All substrates were cleaned in acetone and alcohol before being loaded into the chamber. FIG. 1 provides a schematic drawing of the preferred plasma-enhanced magnetron sputtering system 10 having a process chamber 11. Samples for deposition are identified at 12 on a rotary worktable 14. The magnetron is shown at 16 with a Ti target 18 and magnetron generated plasma 20.

As therefore shown in FIG. 1 the samples 12 are on the rotary worktable 14 that is installed vertically between the targets 18. Tungsten (W) filaments 22 were installed in the chamber to generate an independent global plasma 23 for the plasma enhanced magnetron sputtering (PEMS). The PEMS technique draws electrons off from hot filaments when the electrons have gained sufficient energy to exceed the work function of the filaments. The electrons then collide with neutral gas atoms and generate a relatively large number of gas ions through impact ionization and form a global plasma in the entire chamber which is independent to the magnetron discharge plasma. The discharge current of the hot filament global plasma ($I_D$) can be correlated to a net flow of electrons traveling between the filaments and the anodes. Indeed, the more electrons are drawn off from the filaments with a higher filament power, the more gas ions are generated in the chamber, and therefore the larger the $I_D$ is achieved. During coating depositions, these relatively low energy gas ions are attracted towards substrates/samples by the negative substrate bias voltage as enhanced ion fluxes.

For the representative coating prepared, the chamber was pumped down to a base pressure below $3.0\times10^{-4}$ Pa utilizing a diffusion pump at a baking temperature of 250° C. Prior to coating depositions, the samples/substrates were initially cleaned using the hot filament generated plasma at a discharge current of 5 A and a DC substrate bias voltage of −120 V.

After plasma cleaning the samples/substrates, preferably a Ti adhesion layer (200 nm) was initially deposited by sputtering the Ti targets in pure Ar. Then, preferably, a TiN interlayer (200-300 nm) was deposited by introducing 50 sccm $N_2$ into the chamber. The Ti—Si—C—N nanocomposite coatings can be deposited by sputtering multiple Ti targets, preferably as shown in FIG. 1, in a mixture of Ar, $N_2$, TMS, and $C_2H_2$. During coating depositions, the Ti targets were powered up by pulsed DC (Advanced Energy Pinnacle plus) with a constant average power of 4 kW. The Ar and $N_2$ flow rate were maintained at 100 standard cubic centimeters per minute (sccm) and 50 sccm, respectively. The working pressure during depositions was preferably 0.3 Pa. The hot filament discharge current was maintained at 5 A and a −60 V DC bias voltage was applied to the substrates during depositions.

In the above, one now regulates the flow rate of the carbon-silicon containing gas (TMS) and the carbon containing gas (e.g. $C_2H_2$) during the deposition process, in order to provide the above reference carbon compositional gradient. Accordingly, the carbon-silicon containing gas (e.g., TMS) is set at an initial value of 0 sccm and increased to 6 sccm as the single layer nanocomposite coating is deposited. Similarly, the carbon containing gas (e.g. $C_2H_2$) is also preferably set at an initial value of 0 sccm and increased to 50 sccm as the single layer nanocomposite coating is deposited. It should be noted that in each of these respective cases regarding the introduction of the carbon-silicon containing gas or the carbon containing gas, the increase in their respective flows from a value of zero may preferably define a linear increase over time or a non-linear increase over time, depending upon the carbon content gradient and hardness gradient that one desires to achieve. A linear increase is reference to the feature that the flow rate is increased by the same amount in each unit of time. A non-linear increase is reference to the feature that the flow rate is increased by different amounts in each unit of time. In this manner, a single layer nanocomposite coating is provided, containing a Ti—Si—C—N coating, where again, as noted, there is a relatively higher concentration of carbon and relatively lower hardness at the surface, and a relatively lower concentration and higher hardness at the interface region with the substrate sample.

Figure 2:
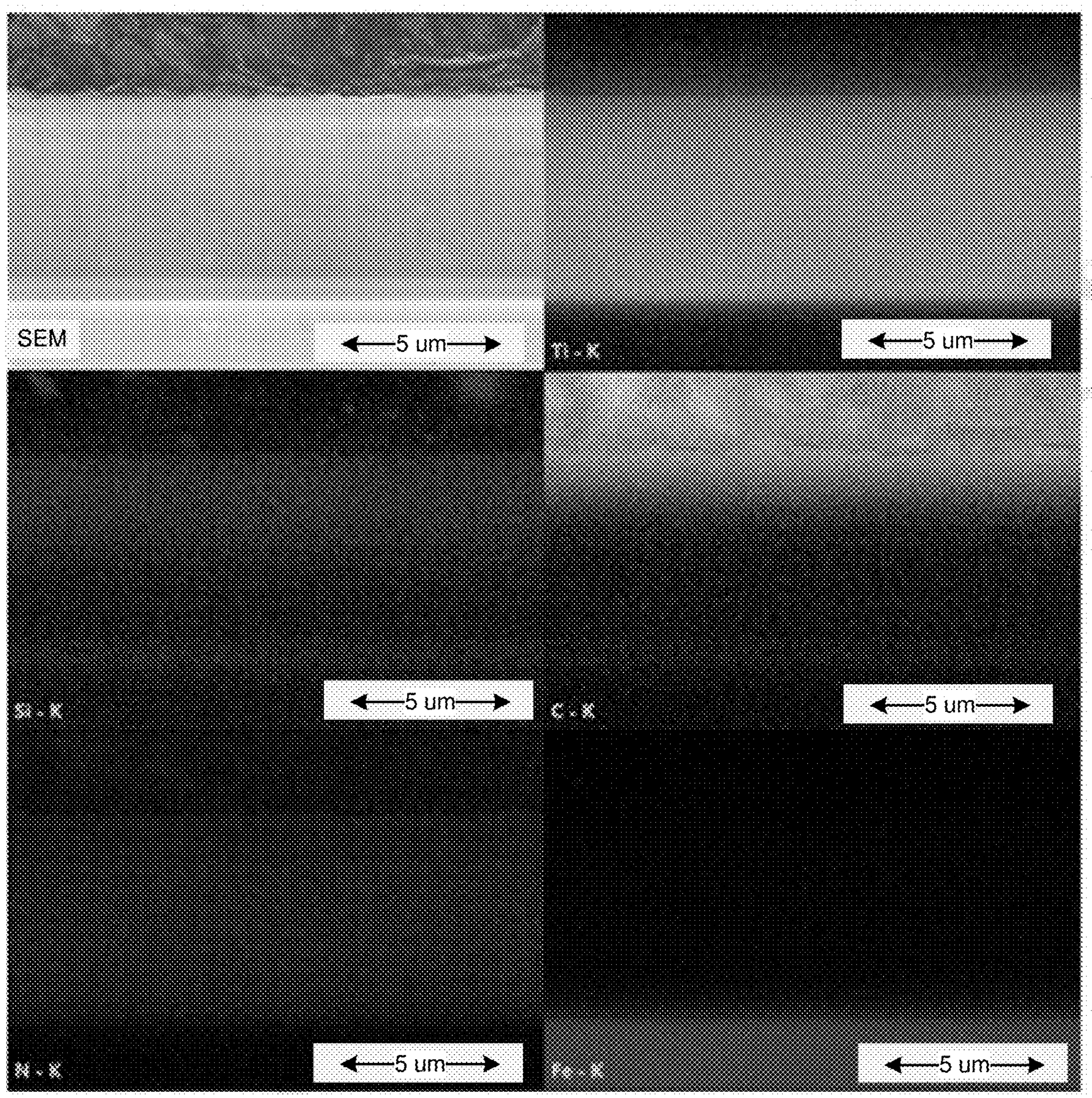
FIG. 2 provides a cross-sectional SEM image and EDS mapping of the elements taken from a variable hardness Ti—Si—C—N coating.

Scanning electron microscopy (SEM) was used to confirm the microstructure and morphology of the coatings. Energy-dispersive X-ray spectroscopy (EDS) was used for the elemental analysis. FIG. 2 shows a cross-sectional SEM image and EDS mapping of the elements taken from a variable hardness Ti—Si—C—N coating. The thickness of the coating is about 6 μm. As shown from the EDS mapping, the Si and C contents in the coating gradually increased from the Ti/TiN interlayer to the top across the thickness of the coating, which confirms the compositionally graded structure of the coating. The SEM images also shows that the microstructure of the coating gradually changed from fine grains to relatively large columnar grains from the bottom to the top of the coating.

What is claimed is:

1. A method of coating a metal part for an engine with a magnetron sputtering system having a process chamber including a magnetron and a Ti target comprising:

placing said metal part having a surface into said process chamber;

reducing gas pressure in said chamber;

supplying an inert gas to said process chamber and generating a plasma for said inert gas;

supplying nitrogen to said process chamber;

supplying both a gas containing carbon and silicon and a carbon containing gas to said process chamber;

sputtering titanium from a magnetron target in said process chamber;

depositing only a single continuous layer of Ti—Si—C—N coating on said metal part surface at a thickness in the range of 5.0 μm to 40 μm including a carbon amorphous phase, wherein an exposed surface region of said coating has a hardness that increases from said coating surface region down to said surface of said metal substrate.

2. The method of claim 1 wherein said gas containing carbon and silicon comprises hexamethyldisilizane and/or tetramethylsilane.

3. The method of claim 1 wherein said carbon containing gas comprises acetylene.

4. The method of claim 1 wherein said surface region of said coating has a hardness in the range of 5.0 GPa to 10.0 GPa and increases to a value of greater than 10.0 GPa to 30.0 GPa below said surface region and down to said surface of said metal part.

5. The method of claim 1 wherein said coating has a thickness of 40.0 μm and said surface region of said coating has a thickness in the range of up to 5.0 μm.

6. The method of claim 1 wherein said coating has a thickness of 20.0 μm and said surface region of said coating has a thickness in the range of up to 5.0.

7. The method of claim 1 wherein said relatively higher hardness portion of said coating provides a wear rate of less than $10\times10^{-6}$ $mm^3$/N/m.

8. The method of claim 1 wherein said relatively higher hardness portion of said coating has a coefficient of friction of less than 0.15.

9. The method of claim 1 wherein said coating comprises 35-49 atomic percent titanium, 1-5 atomic percent of silicon, 17-50 atomic percent of carbon, and 19-35 atomic percent of nitrogen.

10. The method of claim 1 wherein said gas containing carbon and silicon is introduced at a flow rate set at an initial value of 0 sccm and increased to 6 sccm as the single continuous layer nanocomposite coating is deposited and the carbon containing gas in introduced at a flow rate set at an initial value of 0 sccm and increased to 50 sccm as the single continuous layer nanocomposite coating is deposited.

11. The method of claim 1 wherein said coating comprises a Si—N amorphous phase and the carbon amorphous phase and a Ti—C—N crystalline phase.

12. The method of claim 1 wherein the metal part is a gear, piston ring, or camshaft for an engine.

* * * * *